(12) United States Patent
Li et al.

(10) Patent No.: US 12,237,622 B2
(45) Date of Patent: Feb. 25, 2025

(54) SHIELDING PIECE, FEMALE CONNECTOR, CONNECTOR ASSEMBLY, AND COMMUNICATIONS DEVICE

(71) Applicant: HUAWEI TECHNOLOGIES CO., LTD., Guangdong (CN)

(72) Inventors: Wenliang Li, Shenzhen (CN); Tinghe Wu, Dongguan (CN); Shuang Qiu, Dongguan (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 458 days.

(21) Appl. No.: 17/580,809

(22) Filed: Jan. 21, 2022

(65) Prior Publication Data
US 2022/0149569 A1  May 12, 2022

Related U.S. Application Data

(63) Continuation of application No. PCT/CN2020/098876, filed on Jun. 29, 2020.

(30) Foreign Application Priority Data

Jul. 24, 2019  (CN) .......................... 201910670862.8

(51) Int. Cl.
*H01R 13/6587* (2011.01)
*H01R 13/6582* (2011.01)

(52) U.S. Cl.
CPC ..... *H01R 13/6587* (2013.01); *H01R 13/6582* (2013.01)

(58) Field of Classification Search
CPC ............ H01R 13/6581; H01R 13/6582; H01R 13/6583; H01R 13/6585; H01R 13/6586; H01R 13/6587
(Continued)

(56) References Cited

U.S. PATENT DOCUMENTS

| 7,527,526 | B1 | 5/2009 | Chen et al. |
| 2006/0035529 | A1 | 2/2006 | Kuroda et al. |

(Continued)

FOREIGN PATENT DOCUMENTS

| CN | 107492766 A | 12/2017 |
| CN | 109066179 A | 12/2018 |

(Continued)

OTHER PUBLICATIONS

International Search Report and Written Opinion issued in PCT/CN2020/098876, dated Oct. 12, 2020, 10 pages.
(Continued)

*Primary Examiner* — Khiem M Nguyen

(57) ABSTRACT

The technology of this application relates to a shielding piece, a female connector, and a connector assembly. The shielding piece includes a main body and a contact portion, and the contact portion is connected to the main body by using at least two elastic arms or a connecting portion. The connecting portion surrounds the contact portion, and forms, jointly with the contact portion, a convexity protruding from the main body. The at least two elastic arms are connected to the main body at a periphery of the contact portion along different directions, and a gap is formed between the main body and the at least two elastic arms. The contact portion is configured to abut against a ground terminal of a male connector.

20 Claims, 6 Drawing Sheets

(58) Field of Classification Search
USPC .................................................. 439/607.01
See application file for complete search history.

(56) References Cited

U.S. PATENT DOCUMENTS

| | | |
|---|---|---|
| 2012/0135615 A1 | 5/2012 | Mizukami et al. |
| 2015/0044899 A1 | 2/2015 | Fan et al. |

FOREIGN PATENT DOCUMENTS

| | | |
|---|---|---|
| CN | 208508087 U | 2/2019 |
| CN | 109659770 A | 4/2019 |
| CN | 109818211 A | 5/2019 |
| CN | 209056708 U | 7/2019 |
| CN | 110492311 A | 11/2019 |
| EP | 1482601 A1 | 12/2004 |
| WO | 2014144541 A1 | 9/2014 |

OTHER PUBLICATIONS

Office Action issued in CN201910670862.8, dated Jul. 1, 2020, 7 pages.
European Search Report for Application No. EP 20844374 dated Jul. 6, 2022, 6 pages.
Extended European Search Report issued in EP24165672.7, dated Oct. 25, 2024, 8 pages.

SHIELDING PIECE, FEMALE CONNECTOR, CONNECTOR ASSEMBLY, AND COMMUNICATIONS DEVICE

CROSS-REFERENCE TO RELATED APPLICATIONS

This application is a continuation of International Application No. PCT/CN2020/098876, filed on Jun. 29, 2020, which claims priority to Chinese Patent Application No. 201910670862.8, filed on Jul. 24, 2019. The disclosures of the aforementioned applications are hereby incorporated by reference in their entireties.

TECHNICAL FIELD

This application relates to the field of connector technologies, and in particular, to a shielding piece structure in a female connector.

BACKGROUND

In a current communications device system, an interconnection system of a backplane and subcard combination that is based on a printed circuit board (PCB) is a common interconnection architecture. As a bridge between the backplane and the subcard, a backplane connector is presented as a key architecture-level component. For high-speed electrical signal transmission, a loss and a crosstalk property of the backplane connector have important impact on transmission performance of a high-speed link. As a signal channel rate continuously increases, a shielding piece is usually added in addition to a "ground" terminal. In this way, the shielding piece and the "ground" terminal jointly form a common loop path to ensure a good loop path and less crosstalk interference for a connector signal, thereby improving signal return and enhancing an electromagnetic isolation effect. Disposing the shielding piece inside a female connector can provide good return and shielding effects, but a loop path is switched in a region in which coordination with a male connector is implemented. Therefore, a manner of contact between the shielding piece and the "ground" terminal in this coordination region becomes increasingly important.

How to optimize a structure of contact between the shielding piece and the "ground" terminal and further mitigate problems of an insertion loss and crosstalk resonance of the high-speed backplane connector is a direction for continuous research and development in the industry.

SUMMARY

Embodiments of this application provide a shielding piece, a female connector, and a connector assembly to shorten a loop path.

According to a first aspect, this application provides a shielding piece, applied to a female connector, where the shielding piece includes a main body and a contact portion, and the contact portion is connected to the main body through a connecting portion; and the connecting portion surrounds the contact portion, and forms, jointly with the contact portion, a convexity protruding from the main body, and the contact portion is configured to abut against a ground terminal of a male connector. By disposing the connecting portion to connect to the contact portion, a contact portion with a relatively large area is obtained, an inductance is reduced, and a sudden inductive change of a current is reduced. Further, a plurality of signal loop paths are established, and a current enters the ground terminal of the male connector from the main body over a shortest path that is selected by proximity. This shortens a signal loop path, thereby reducing an insertion loss, and mitigating crosstalk and resonance problems. When the shielding piece is used with a high-speed backplane connector, an insertion loss of the high-speed backplane connector can be reduced.

In a possible implementation, the main body includes an edge region and a central region, the contact portion extends from the central region to the edge region, an extending direction of the contact portion is a first direction, and the contact portion is strip-shaped. A shape and the extending direction of the contact portion are set, so that a strip-shaped structure of the contact portion overlaps a strip-shaped structure of the ground terminal to increase a contact area between the contact portion and the ground terminal and reduce an inductance of a current loop. In addition, because the contact portion extends in the first direction from the central region to the edge region, a distance from the central region to the contact portion is shortened, thereby shortening a current loop path of the central region and mitigating the resonance problem.

In a possible implementation, the connecting portion is in a closed ring shape and fully surrounds the contact portion. A closed ring structure enables a current to return to the contact portion from each location of all around. This is equivalent to increasing a quantity of loop paths, thereby helping reduce an insertion loss and mitigating the resonance problem.

In a possible implementation, the connecting portion includes a plurality of spaced and arranged strip-shaped structures. The plurality of spaced and arranged strip-shaped structures surround a periphery of the contact portion, and there is a gap between adjacent strip-shaped structures. This can also increase the quantity of loop paths, thereby reducing an insertion loss and improving the resonance problem.

In a possible implementation, the connecting portion includes a first connecting end connected to the contact portion and a second connecting end connected to the main body, and a size of the first connecting end is less than a size of the second connecting end. In this way, when the contact portion is in contact with the ground terminal, the connecting portion provides sufficient support, and the connecting portion has no stress-concentrated location, thereby avoiding damage caused by a brittle fracture occurring when the connecting portion is stressed.

In a possible implementation, the contact portion has a planar shape, and is in surface contact with the ground terminal. The surface contact can maximize the contact area between the contact portion and the ground terminal. This helps reduce an inductance.

In a possible implementation, the connecting portion is an integrated structure, and there is no gap between the contact portion and the main body, so that a current on the main body flows from the periphery of the contact portion to the contact portion, thereby shortening a current loop path at each location on the main body, and reducing a loop inductance.

According to a second aspect, this application provides a shielding piece, applied to a female connector, where the shielding piece includes a main body and a contact portion, and the contact portion is connected to the main body by using at least two elastic arms; and the at least two elastic arms are connected to the main body from adjacent or opposite sides of the contact portion, a gap is formed between the main body and the at least two elastic arms, and the contact portion is configured to abut against a ground terminal of a male connector. By disposing the at least two elastic arms to connect to the contact portion, a contact portion with a relatively large area is obtained, an inductance is reduced, and a sudden inductive change of a current is reduced. Further, a plurality of signal loop paths are established, and a current enters the ground terminal of the male connector from the main body over a shortest path that is selected by proximity. This shortens a signal loop path, thereby reducing an insertion loss, and mitigating crosstalk and resonance problems. Specifically, the at least two elastic arms and the contact portion serve as an integrated elastomer structure.

In a possible implementation, a quantity of the elastic arms is 2, the elastic arms are respectively located on the two opposite sides of the contact portion, and the main body includes an edge region and a central region, where one of the elastic arms is connected between the contact portion and the central region, and the other elastic arm is connected between the contact portion and the edge region. Specific locations of a first elastic arm and a second elastic arm are set, so that the contact portion is in stable contact with the ground terminal. In addition, the first elastic arm forms a first loop path, and the second elastic arm forms a second loop path, so as to increase a quantity of loop paths, optimize a return current, and mitigate resonance problem.

In a possible implementation, the two elastic arms form an integrated structure together with the contact portion and the main body. The integrated structure not only can make a structure of the contact portion more stable, but also can increase a contact area between the contact portion and the ground terminal. This helps reduce an inductance of a current loop, optimize a loop path, and mitigate the resonance problem.

In a possible implementation, one of the elastic arms is a first elastic arm, a remaining elastic arm is a second elastic arm, the first elastic arm and the contact portion jointly constitute a first loop path of signal between the main body and the ground terminal, and the second elastic arm and the contact portion jointly constitute a second signal loop path between the main body and the ground terminal. A plurality of elastic arms are disposed, so that there are a plurality of signal flow paths, current return of the shielding piece is accelerated, a return current is optimized, and resonance problem is mitigated.

In a possible implementation, the main body includes an edge region and a central region, the first elastic arm is connected between the contact portion and the central region, and the second elastic arm is connected between the contact portion and the edge region. Specific locations of the first elastic arm and the second elastic arm are set, so that the contact portion is in stable contact with the ground terminal, a loop path is increased, and resonance is mitigated.

In a possible implementation, the contact portion has a planar shape, and is in surface contact with the ground terminal. The surface contact can maximize the contact area between the contact portion and the ground terminal. This helps reduce an inductance.

According to a third aspect, this application provides a female connector, including a ground pin and the shielding piece according to any one of the various implementations of the first aspect and those of the second aspect, where the ground pin is disposed opposite to the contact portion, and a socket for inserting the ground terminal of the male connector is formed between the ground pin and the contact portion.

According to a fourth aspect, this application provides a connector assembly, including a male connector and the female connector according to the third aspect, where the male connector includes a ground terminal, and the ground terminal is inserted into the socket, so that the ground terminal is electrically connected to the ground pin and the contact portion of the shielding piece.

BRIEF DESCRIPTION OF DRAWINGS

To describe technical solutions in embodiments of this application or in the background more clearly, the following describes the accompanying drawings for describing the embodiments of this application or the background.

DESCRIPTION OF EMBODIMENTS

The following describes embodiments of this application with reference to the accompanying drawings in the embodiments of this application.

Figure 1:
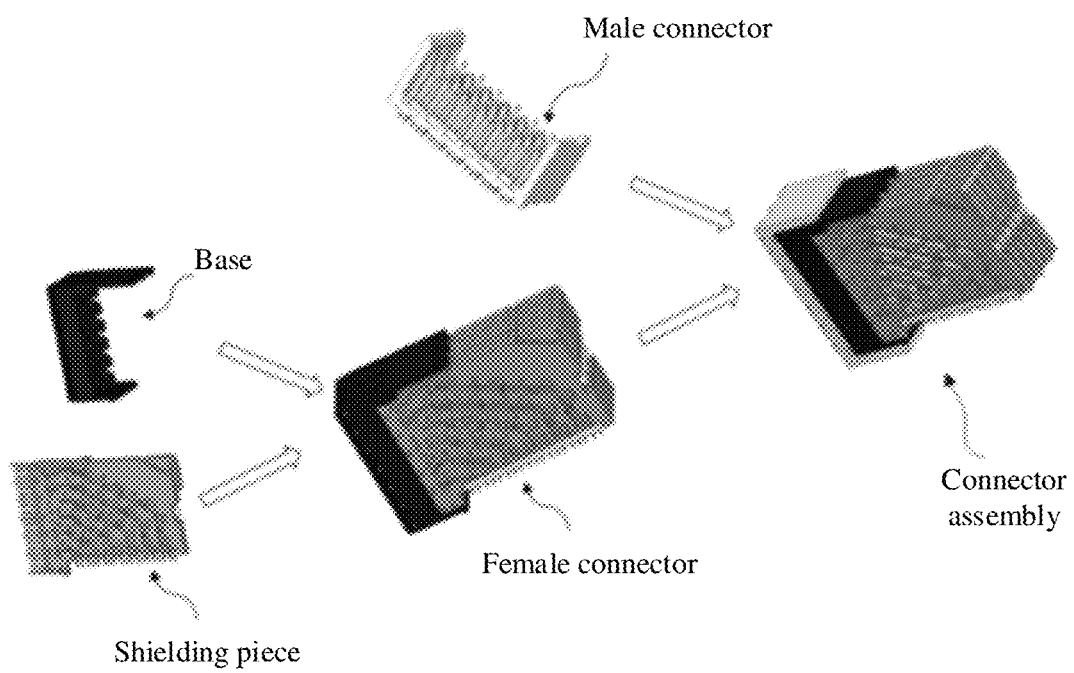
FIG. 1 is an example schematic diagram of a forming process of a connector assembly according to an embodiment.

A backplane and a board are disposed in a communications device, and high-speed signal interconnection is provided between boards or between the board and the backplane, so as to implement a communications function. In an example of a connection between the board and the backplane, a stable connection needs to be established between the board and the backplane, so as to implement signal interconnection. Referring to FIG. 1, the board is connected to the backplane by using a connector assembly. Specifically, the connector assembly includes a male connector and a female connector, and the female connector includes a base and a plurality of shielding pieces. One end of the male connector is connected to the backplane, and the other end of the male connector is connected to the female connector, specifically, connected to one end of the shielding piece. The board is connected to the shielding piece. In this way, the board is connected to the backplane.

With development of communications technologies, a signal frequency and a transmission rate become increasingly high, and a structure of a connector assembly has growing impact on the signal transmission rate. An improvement of this application is to reduce the impact of the structure of the connector assembly on the signal transmission rate. A complete signal loop in the connector assembly includes two parts: one part is a signal path composed of a signal terminal in the male connector and a signal terminal in the female connector; and the other part is a signal loop path composed of a ground terminal of the male connector, a ground terminal of the female connector, and the shielding piece of the female connector. Inductances of the two paths form an inductance of the entire loop.

In a connector, a mutual inductance between two adjacent signal loops directly affects coupling between the two loops. If an inductance of a signal loop path is increased, the mutual inductance between the signal loops is increased, and further coupling between the two loops is enhanced. After the coupling is enhanced, energy on one signal loop is coupled to the other loop. As a result, an insertion loss and crosstalk resonance occur on the signal path. Therefore, one of important factors affecting the signal transmission rate is a signal loop path on a shielding piece, and a sudden inductance increase of the signal loop path causes resonance. In view of this, this application improves a shielding piece to reduce the foregoing impact.

Referring to FIG. 3, FIG. 4, FIG. 8, and FIG. 9, an embodiment of this application provides a female connector 100, including a ground pin 14 and the shielding piece (referring to a reference numeral of a main body 10 of the shielding piece) provided in the embodiments of this application. The ground pin 14 is disposed opposite to a contact portion 11 of the shielding piece, and a socket for inserting a ground terminal 21 of a male connector 200 is formed between the ground pin 14 and the contact portion 11.

In a possible implementation, the female connector 100 further includes a first base 15. An edge of the shielding piece is connected to the first base 15, so that the shielding piece is fixed. The ground pin 14 extends from the first base 15 to form a structure of an elastic cantilever. The male connector 200 has a second base 20, and the ground terminal 21 is fixed to the second base 20.

Referring to FIG. 3, FIG. 4, FIG. 8, and FIG. 9, an embodiment of this application further provides a connector assembly, including a male connector 200 and the female connector 100 provided in the embodiments of this application. The male connector 200 includes a ground terminal 21, and the ground terminal 21 is inserted into a socket, so that the ground terminal 21 is electrically connected to the ground pin 14 and the contact portion 11 of the shielding piece.

The shielding piece provided in the embodiments of this application is applied to the female connector 100, and the female connector 100 and the male connector 200 are plug-connected to each other inside a communications device to form a connector assembly, which may be used to implement electrical connections between various boards and backplanes (such as PCBs). When the female connector 100 and the male connector 200 are plug-connected to each other, the contact portion 11 is in contact with the ground terminal 21. A current on the shielding piece returns to the ground terminal 21 and the male connector 200 through the contact portion 11. This can reduce signal crosstalk impact of the shielding piece on the communications device, thereby mitigating a resonance problem.

The following describes a structure of the shielding piece.

Embodiment 1

As shown in FIG. 1 to FIG. 4, this embodiment provides a shielding piece, and the shielding piece includes a main body 10 and a contact portion 11. The contact portion 11 is connected to the main body 10 by using two elastic arms. The two elastic arms are a first elastic arm 12 and a second elastic arm 13. The first elastic arm 12 and the second elastic arm 13 are respectively located on two opposite sides of the contact portion 11. In another embodiment, alternatively, there may be at least two elastic arms, for example, three or four elastic arms. On the contact portion 11, the at least two elastic arms are connected to the main body 10 from adjacent or opposite sides of the contact portion 11 (in other words, the at least two elastic arms are distributed in a periphery of the contact portion, and are respectively located on the adjacent or opposite sides of the contact portion). In addition, a gap 101 is formed between the main body 10 and the at least two elastic arms, and the contact portion 11 is configured to abut against the ground terminal 21 of the male connector 200.

By disposing the at least two elastic arms to connect to the contact portion 11, a contact portion 11 with a relatively large area is obtained, an inductance is reduced, and a sudden inductive change of a current is reduced. Further, a plurality of signal loop paths are established, and a current enters the ground terminal 21 of the male connector 200 from the main body 10 over a shortest path that is selected by proximity. This shortens a signal loop path, thereby reducing an insertion loss, and mitigating crosstalk and resonance problems.

In this embodiment, the contact portion 11 has a planar shape, and is in surface contact with the ground terminal 21. The surface contact can maximize a contact area between the contact portion 11 and the ground terminal 21. This helps reduce an inductance. In this embodiment, the contact portion 11 may alternatively have an arc surface, and at least a part of the contact portion 11 is in surface contact with the ground terminal 21.

When a quantity of elastic arms is greater than 2, one of the elastic arms is the first elastic arm, and remaining elastic arms are the second elastic arms. The first elastic arm and the contact portion 11 jointly constitute a first loop path 105 of a signal between the main body 10 and the ground terminal 21, and each of the second elastic arms and the contact portion 11 jointly constitute a second loop path 106 of a signal between the main body 10 and the ground terminal 21. The first loop path 105 is a signal flow path, and the second loop paths 106 are a plurality of remaining signal flow paths. A quantity of signals flowing through the first loop path 105 may be greater than a quantity of signals flowing through the second loop paths 106. The signals herein refer to current signals. A plurality of elastic arms are disposed, so that there are a plurality of signal flow paths, current return of the shielding piece is accelerated, a return current is optimized, and resonance is mitigated.

Figure 2:
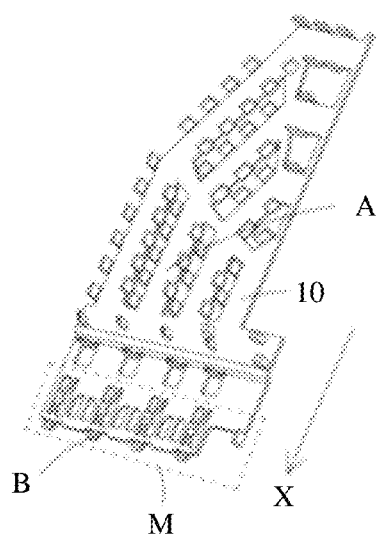
FIG. 2 is an example schematic diagram of a three-dimensional structure of a shielding piece according to an embodiment.
Figure 3:
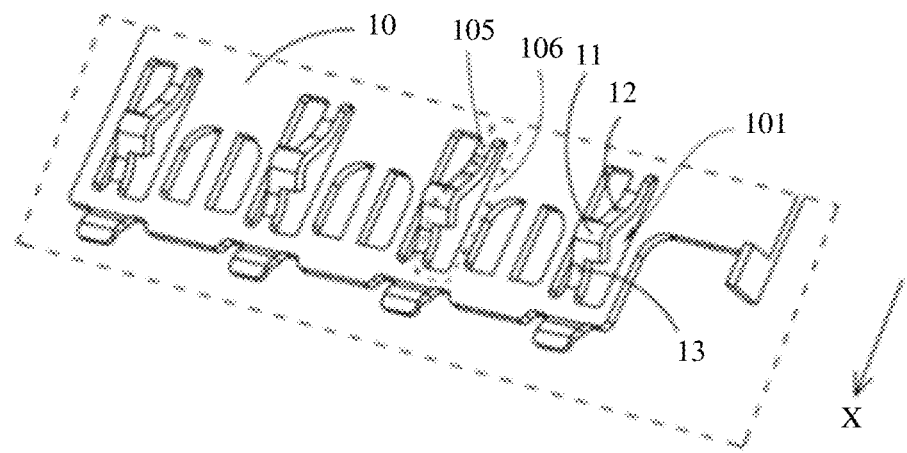
FIG. 3 is an example partially enlarged schematic diagram of a structure of a location M in FIG. 2.
Figure 4:
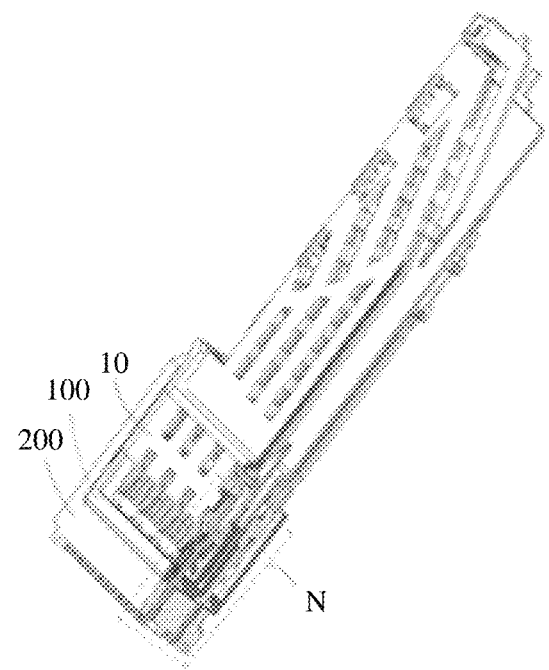
FIG. 4 is an example schematic diagram of a three-dimensional structure of a connector assembly according to an embodiment, where a partial cross-sectional structure is shown in the diagram.
Figure 5:
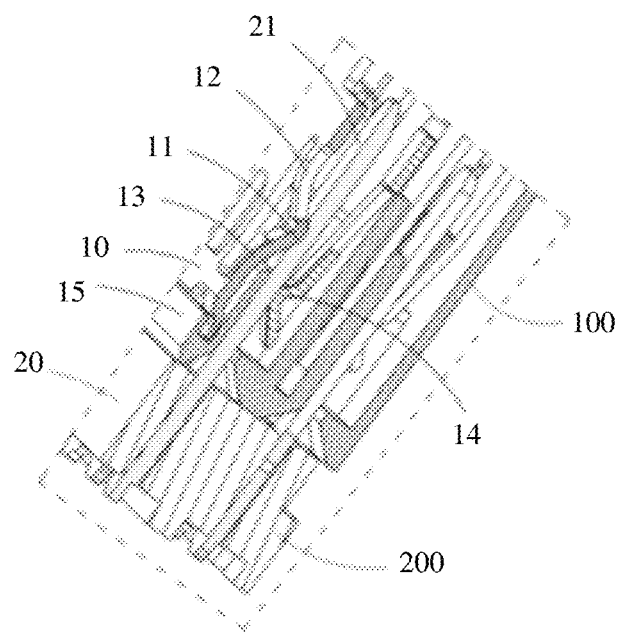
FIG. 5 is an example partially enlarged schematic diagram of a structure of a location N in FIG. 4.
Figure 6:
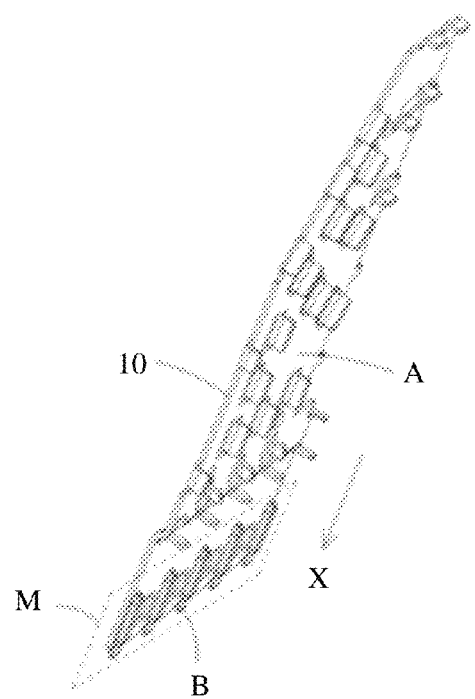
FIG. 6 is an example schematic diagram of a three-dimensional structure of a shielding piece according to another embodiment.
Figure 7:
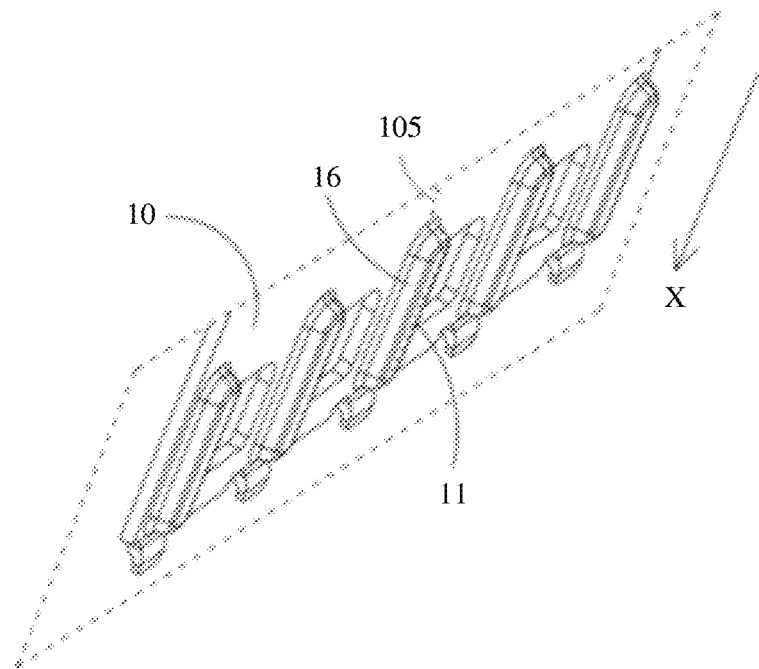
FIG. 7 is an example partially enlarged schematic diagram of a structure of a location M in FIG. 6.
Figure 8:
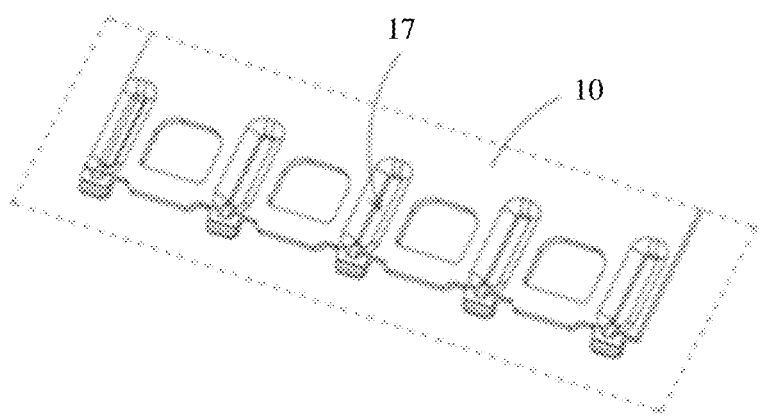
FIG. 8 is an example schematic diagram of the structure in FIG. 7 from another perspective.
Figure 9:
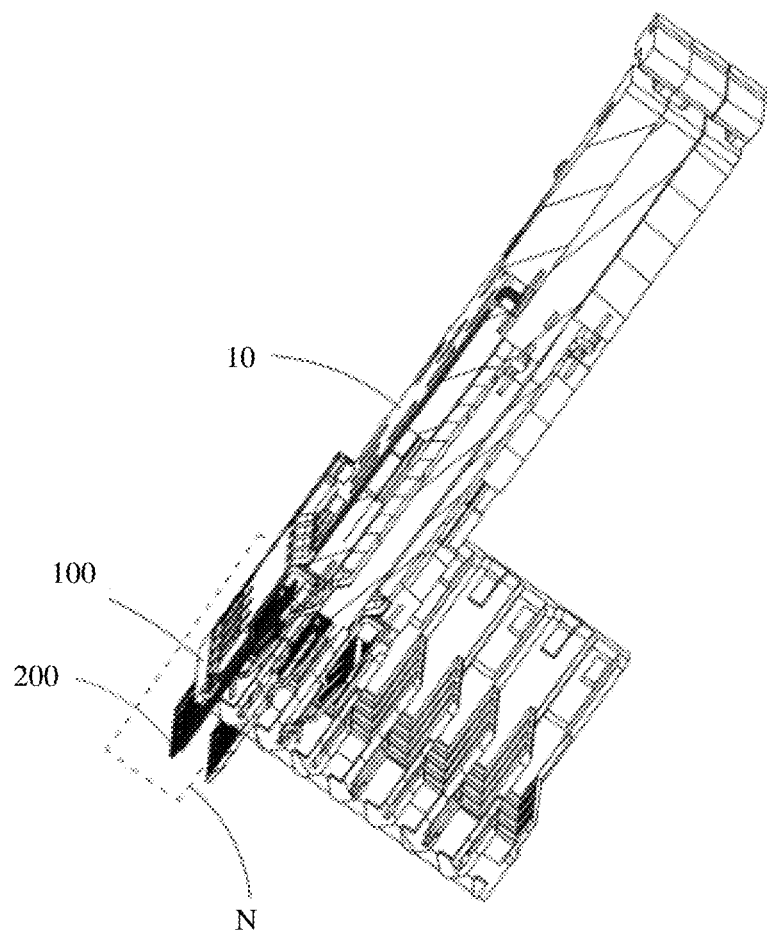
FIG. 9 is an example schematic diagram of a three-dimensional structure of a connector assembly according to another embodiment, where a partial cross-sectional structure is shown in the diagram.

Referring to FIG. 1 and FIG. 2, that the quantity of elastic arms is 2 is used as an example. Reference is similar when the quantity of elastic arms is greater than 2. The two elastic arms (namely, the first elastic arm 12 and the second elastic arm 13), the contact portion 11, and the main body 10 form an integrated structure. The integrated structure not only can make a structure of the contact portion 11 more stable, but also can increase the contact area between the contact portion 11 and the ground terminal 21. This helps reduce an inductance of a current loop, optimize a loop path, and mitigate the resonance problem.

In an embodiment, referring to FIG. 1 and FIG. 2, that the quantity of elastic arms is 2 is used as an example. The main body 10 includes an edge region B and a central region A. The first elastic arm 12 is connected between the contact portion 11 and the central region A. The second elastic arm 13 is connected between the contact portion 11 and the edge region B. In other words, the contact portion 11 is disposed at a location of the main body 10 that is close to an edge, and an edge location of the main body 10 is a location at which the female connector and the male connector 200 are mutually staggered when being connected. At this location, the contact portion 11 can reach contact with the ground terminal 21. Therefore, specific locations of the first elastic arm 12 and the second elastic arm 13 are set, so that the contact portion 11 is in stable contact with the ground terminal 21. In addition, the first elastic arm 12 forms the first loop path 105, and a larger amount of a current returned from the central region A flows to the contact portion 11 through the first loop path 105; and the second elastic arm 13 forms the second loop path 106, and a smaller amount of the current returned from the central region A flows to the contact portion 11 through the second loop path 106, thereby implementing a supplement to the first loop path 105. In another embodiment, when the quantity of elastic arms is greater than 2, the first elastic arm is also connected between the contact portion 11 and the central region A, and the plurality of second elastic arms are connected between the contact portion 11 and the edge region B. Functions of the first elastic arm and the second arms are the same as those in the embodiment with two elastic arms.

In an embodiment, the contact portion 11 extends from the central region A to the edge region B, an extending direction of the contact portion 11 is a first direction X, and the contact portion 11 is strip-shaped. The ground terminal 21 is also strip-shaped. When the female connector is connected to the male connector 200, a strip-shaped structure of the ground terminal 21 extends into the female connector along an opposite direction of the first direction X to reach contact with the contact portion 11. Therefore, a shape and the extending direction of the contact portion 11 are set, so that a strip-shaped structure of the contact portion 11 overlaps the strip-shaped structure of the ground terminal 21 to increase the contact area between the contact portion 11 and the ground terminal 21 and reduce an inductance of a current loop. In addition, because the contact portion 11 extends in the first direction X from the central region A to the edge region B, a distance from the central region A to the contact portion 11 is shortened, thereby shortening a current loop path in the central region A and mitigating the resonance problem.

Embodiment 2

Figure 10:
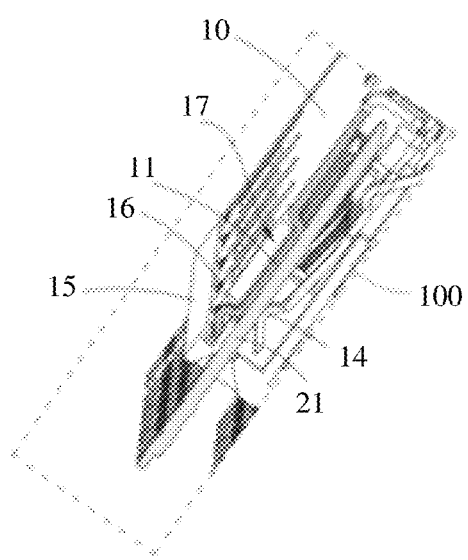
FIG. 10 is an example partially enlarged schematic diagram of a structure of a location N in FIG. 9.

Referring to FIG. 5 to FIG. 9 (and FIG. 10 which shows an example partially enlarged schematic diagram of a structure of a location N in FIG. 9), this embodiment provides a shielding piece, and a contact portion 11 is connected to a main body 10 through a connecting portion 16. The connecting portion 16 surrounds the contact portion 11, and forms, jointly with the contact portion 11, a convexity protruding from the main body 10.

Compared with Embodiment 1, in this embodiment, the connecting portion 16 is used to connect the contact portion 11 to the main body 10, so that the contact portion 11 can have a larger area, a simpler structure, and an easier manufacturing process.

Specifically, the connecting portion 16 may be formed by disposing a projection on the main body 10, or may be formed by stamping the main body 10. When a stamping process is used, a recess 17 is formed on a side of the main body 10 that faces away from the contact portion 11.

The contact portion 11 has a planar shape, and is in surface contact with a ground terminal 21.

The connecting portion 16 surrounds the contact portion 11, so that a current at each location of the main body 10 can be looped through the connecting portion 16 in a periphery of the contact portion 11. This is equivalent to increasing a quantity of loop paths, and the current at each location of the main body 10 is returned to the contact portion 11 on a nearest loop path that is selected by proximity. Therefore, similar to Embodiment 1, this embodiment helps reduce an insertion loss and reduce an inductance of a current loop, thereby mitigating crosstalk and resonance problems.

In an embodiment, the connecting portion 16 is in a closed ring shape and fully surrounds the contact portion 11. A closed ring structure enables a current to return to the contact portion 11 from each location of all around. This is equivalent to increasing a quantity of loop paths, thereby helping reduce an insertion loss and mitigating the resonance problem. In another embodiment, the connecting portion 16 includes a plurality of spaced and arranged strip-shaped structures. The plurality of spaced and arranged strip-shaped structures surround the periphery of the contact portion 11, and there is a gap between adjacent strip-shaped structures, so as to form a structure similar to the elastic arms in Embodiment 1.

In an embodiment, the connecting portion 16 is an integrated structure, and there is no gap between the contact portion 11 and the main body 10, so that a current on the main body 10 flows from the periphery of the contact portion 11 to the contact portion 11, thereby shortening a current loop path at each location on the main body 10, and reducing a loop inductance.

In an embodiment, the connecting portion 16 includes a first connecting end connected to the contact portion 11 and a second connecting end connected to the main body 10, and a size of the first connecting end is less than a size of the second connecting end. In other words, the connecting portion 16 is approximately a trapezoidal structure in a cross section of an extending direction of the contact portion 11. The first connecting end and the second connecting end each are in a curved shape, so that smooth transition is implemented between the connecting portion 16 and each of the main body 10 and the contact portion 11. In this way, when the contact portion 11 is in contact with the ground terminal 21, the connecting portion 16 provides sufficient support, and the connecting portion 16 has no stress-concentrated location, thereby avoiding damage caused by a brittle fracture occurring when the connecting portion 16 is stressed.

The embodiments of this application are described in detail above. The principle and embodiments of this application are described herein through specific examples. The description about the foregoing embodiments is merely provided to help understand the method and core ideas of this application. In addition, a person of ordinary skill in the art can make variations to the specific embodiments and the application scope according to the ideas of this application. Therefore, the content of specification shall not be construed as a limitation on this application.

What is claimed is:

1. A female connector, comprising:
a shielding piece; and
a ground pin, wherein
the shielding piece includes:
a main body; and
a contact portion, wherein
the contact portion is connected to the main body through a connecting portion, the connecting portion surrounds the contact portion, and forms, jointly with the contact portion, a convexity protruding from the main body,
the contact portion is configured to abut against a ground terminal of a male connector, and
the ground pin is disposed opposite to the contact portion, and a socket for inserting the ground terminal of the male connector is formed between the ground pin and the contact portion.

2. The female connector according to claim 1, wherein the main body includes an edge region and a central region,
the contact portion extends from the central region to the edge region,
an extending direction of the contact portion is a first direction, and
the contact portion is strip-shaped.

3. The female connector according to claim 1, wherein the connecting portion is in a closed ring shape and the connecting portion fully surrounds the contact portion.

4. The female connector according to claim 1, wherein the connecting portion includes a first connecting end connected to the contact portion and a second connecting end connected to the main body, and
a size of the first connecting end is less than a size of the second connecting end.

5. The female connector according to claim 1, wherein the contact portion has a planar shape or the contact portion has an arc surface, and
the contact portion is in surface contact with the ground terminal of the male connector.

6. The female connector according to claim 1, wherein the connecting portion is an integrated structure, and
no gap exists between the contact portion and the main body.

7. The female connector according to claim 1, wherein the connecting portion is approximately a trapezoidal structure in a cross section of the extending direction of the contact portion.

8. The female connector according to claim 4, wherein the first connecting end and the second connecting end are each in a curved shape.

9. A female connector, comprising:
a shielding piece, wherein
the shielding piece includes:
a main body, and
a contact portion, wherein
the contact portion is connected to the main body using at least two elastic arms;
the at least two elastic arms are connected to the main body from adjacent or opposite sides of the contact portion,
a gap is formed between the main body and the at least two elastic arms, and
the contact portion is configured to abut against a ground terminal of a male connector.

10. The female connector according to claim 9, wherein a quantity of the elastic arms is 2,
the at least two elastic arms are respectively located on two opposite sides of the contact portion, and
the main body includes an edge region and a central region, wherein
one of the at least two elastic arms is connected between the contact portion and the central region, and
the other elastic arm, of the at least two elastic arms, is connected between the contact portion and the edge region.

11. The female connector according to claim 10, wherein the at least two elastic arms form an integrated structure together with the contact portion and the main body.

12. The female connector according to claim 9, wherein the at least two elastic arms include:
a first elastic arm, and
a second elastic arm, wherein
the first elastic arm and the contact portion jointly constitute a first signal loop path between the main body and the ground terminal, and
the second elastic arm and the contact portion jointly constitute a second signal loop path between the main body and the ground terminal.

13. The female connector according to claim 9, wherein the main body includes an edge region and a central region,
a first elastic arm is connected between the contact portion and the central region, and
a second elastic arm is connected between the contact portion and the edge region.

14. The female connector according to claim 9, wherein the contact portion has a planar shape or the contact portion has an arc surface.

15. The female connector according to claim 9, wherein the contact portion is in surface contact with the ground terminal of the male connector.

16. The female connector according to claim 9, wherein the contact portion is disposed at a location of the main body close to an edge, and
an edge location of the main body includes a location at which the female connector and the male connector are mutually staggered when being connected.

17. A communication apparatus, comprising:
a male connector; and
a female connector, wherein the female connector includes:
a shielding piece; and
a ground pin, wherein
the shielding piece includes:
a main body; and
a contact portion, wherein
the contact portion is connected to the main body through a connecting portion,
the connecting portion surrounds the contact portion, and forms, jointly with the contact portion, a convexity protruding from the main body,
the contact portion is configured to abut against a ground terminal of a male connector, and
the ground pin is disposed opposite to the contact portion, and a socket for inserting the ground terminal of the male connector is formed between the ground pin and the contact portion.

18. The communication apparatus according to claim 17, wherein the communication apparatus includes a connector assembly.

19. The communication apparatus according to claim 17, wherein
the communication apparatus includes a communications device comprising a first card and a second card, and
the first card is connected to the second card though a connector assembly including the male connector and the female connector.

20. The female connector according to claim 9, further comprising:

a ground pin, wherein
the ground pin is disposed opposite to the contact portion, and a socket for inserting the ground terminal of the male connector is formed between the ground pin and the contact portion.

\* \* \* \* \*